United States Patent
Inao et al.

(10) Patent No.: US 9,048,311 B2
(45) Date of Patent: Jun. 2, 2015

(54) LAMINATE AND METHOD FOR SEPARATING THE SAME

(75) Inventors: Yoshihiro Inao, Kawasaki (JP); Yasushi Fujii, Kawasaki (JP); Atsushi Matsushita, Kawasaki (JP); Koki Tamura, Kawasaki (JP); Atsushi Kubo, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 149 days.

(21) Appl. No.: 13/880,802

(22) PCT Filed: Aug. 25, 2011

(86) PCT No.: PCT/JP2011/069173
§ 371 (c)(1),
(2), (4) Date: Apr. 22, 2013

(87) PCT Pub. No.: WO2012/056803
PCT Pub. Date: May 3, 2012

(65) Prior Publication Data
US 2013/0220554 A1 Aug. 29, 2013

(30) Foreign Application Priority Data

Oct. 29, 2010 (JP) .................. 2010-243160
Apr. 28, 2011 (JP) .................. 2011-102229

(51) Int. Cl.
*B32B 38/10* (2006.01)
*B32B 17/06* (2006.01)
(Continued)

(52) U.S. Cl.
CPC ............... *H01L 21/7813* (2013.01); *B32B 7/06* (2013.01); *C03C 17/3452* (2013.01);
(Continued)

(58) Field of Classification Search
CPC .................................................. C03C 17/3452
USPC .................................................. 156/712, 930
See application file for complete search history.

(56) References Cited

U.S. PATENT DOCUMENTS

| 4,909,806 A | 3/1990 | Garbe |
| 5,752,442 A * | 5/1998 | Johnson et al. ............... 101/211 |

(Continued)

FOREIGN PATENT DOCUMENTS

| EP | 0 858 110 A1 | 8/1998 |
| EP | 1 351 308 A1 | 10/2003 |

(Continued)

OTHER PUBLICATIONS

Silverstein et al., "Spectrometric Identification of Organic Compounds," Yuukikagoubutsu no supekutoru niyoru douteihou, Fifth Edition, —MS, IR, NMR, UV no heiyou—, pp. 146-151, 1992.

(Continued)

*Primary Examiner* — Mark A Osele
(74) *Attorney, Agent, or Firm* — Knobbe Martens Olson & Bear LLP

(57) ABSTRACT

A laminate including a supporting member which is light transmissive; a supported substrate supported by the supporting member; an adhesive layer provided on a surface of the supported substrate which surface faces toward the supporting member; and a release layer which is made of a fluorocarbon and is provided between the supporting member and the supported substrate, the release layer having a property that changes when it absorbs light coming through the supporting member.

5 Claims, 2 Drawing Sheets

(1) LASER BEAM IRRADIATION (2) PROPERTY CHANGE OF RELEASE LAYER (3) SUPPORTING MEMBER IS SEPARATED

(51) Int. Cl.
*H01L 21/78* (2006.01)
*H01L 21/683* (2006.01)
*H01L 23/00* (2006.01)
B32B 7/06 (2006.01)
C03C 17/34 (2006.01)

(52) U.S. Cl.
CPC .. *H01L 21/6835* (2013.01); *H01L 2221/68318* (2013.01); *H01L 2221/68327* (2013.01); *H01L 2221/6834* (2013.01); *H01L 2221/68381* (2013.01); *H01L 23/562* (2013.01); *H01L 2924/0002* (2013.01)

(56) References Cited

U.S. PATENT DOCUMENTS

| | | | |
|---|---|---|---|
| 6,881,765 B2 | 4/2005 | Sasaki et al. | |
| 6,897,004 B2 | 5/2005 | Uenishi et al. | |
| 7,108,955 B2 | 9/2006 | Iwasawa et al. | |
| 7,462,551 B2 | 12/2008 | Kulkarni et al. | |
| 7,883,991 B1 | 2/2011 | Wu et al. | |
| 8,173,519 B2 | 5/2012 | Morisue et al. | |
| 2003/0019576 A1 | 1/2003 | Torres-Filho et al. | |
| 2003/0024635 A1 | 2/2003 | Utsunomiya | |
| 2004/0016504 A1* | 1/2004 | Mitarai | 156/247 |
| 2005/0130391 A1 | 6/2005 | Takayama et al. | |
| 2005/0233547 A1 | 10/2005 | Noda et al. | |
| 2006/0231527 A1 | 10/2006 | Takayama et al. | |
| 2008/0014532 A1 | 1/2008 | Kessel et al. | |
| 2009/0111279 A1 | 4/2009 | Sakashita | |
| 2009/0115075 A1 | 5/2009 | Kessel et al. | |
| 2009/0133812 A1 | 5/2009 | Noda et al. | |
| 2010/0038035 A1 | 2/2010 | Noda et al. | |
| 2010/0041211 A1 | 2/2010 | Noda et al. | |
| 2010/0273326 A1 | 10/2010 | Nakamura et al. | |
| 2011/0067808 A1 | 3/2011 | Nishio et al. | |
| 2011/0091811 A1 | 4/2011 | Song et al. | |
| 2011/0139375 A1 | 6/2011 | Yamamoto et al. | |
| 2011/0297771 A1 | 12/2011 | Noda et al. | |
| 2014/0151328 A1* | 6/2014 | Miyanari et al. | 216/33 |
| 2014/0255638 A1* | 9/2014 | Imai et al. | 428/41.3 |
| 2014/0332149 A1* | 11/2014 | Fujii et al. | 156/242 |
| 2015/0010724 A1* | 1/2015 | Ogata et al. | 428/40.7 |

FOREIGN PATENT DOCUMENTS

| | | |
|---|---|---|
| EP | 1 655 633 A2 | 5/2006 |
| EP | 1 744 365 A2 | 1/2007 |
| EP | 1 758 169 A2 | 2/2007 |
| JP | A-10-125929 | 5/1998 |
| JP | A-2002-217390 | 8/2002 |
| JP | A-2002-226796 | 8/2002 |
| JP | A-2004-64040 | 2/2004 |
| JP | A-2004-238464 | 8/2004 |
| JP | A-2005-183689 | 7/2005 |
| JP | A-2005-197673 | 7/2005 |
| JP | A-2007-188967 | 7/2007 |
| JP | 2007-258663 A | 10/2007 |
| JP | A-2008-166578 A | 7/2008 |
| JP | 2009-263316 | 11/2009 |
| JP | 2009-263596 | 11/2009 |
| JP | 2010-120901 A | 6/2010 |
| KR | 10-2008-0071139 A | 8/2008 |
| KR | 10-2009-0031562 | 3/2009 |

OTHER PUBLICATIONS

International Search Report issued in Application No. PCT/JP2011/073245 on Dec. 27, 2011.
Office Action issued in U.S. Appl. No. 13/290,412 on Nov. 21, 2013.
International Search Report issued in International Patent Application No. PCT/JP2011/069173 on Nov. 22, 2011.
Office Action in U.S. Appl. No. 14/183,988, mailed Sep. 26, 2014.
Office Action in U.S. Appl. No. 13/881,114, mailed Jan. 22, 2015.
Office Action in Korean Patent Application No. 10-2013-7012942 dated Apr. 13, 2015.

* cited by examiner

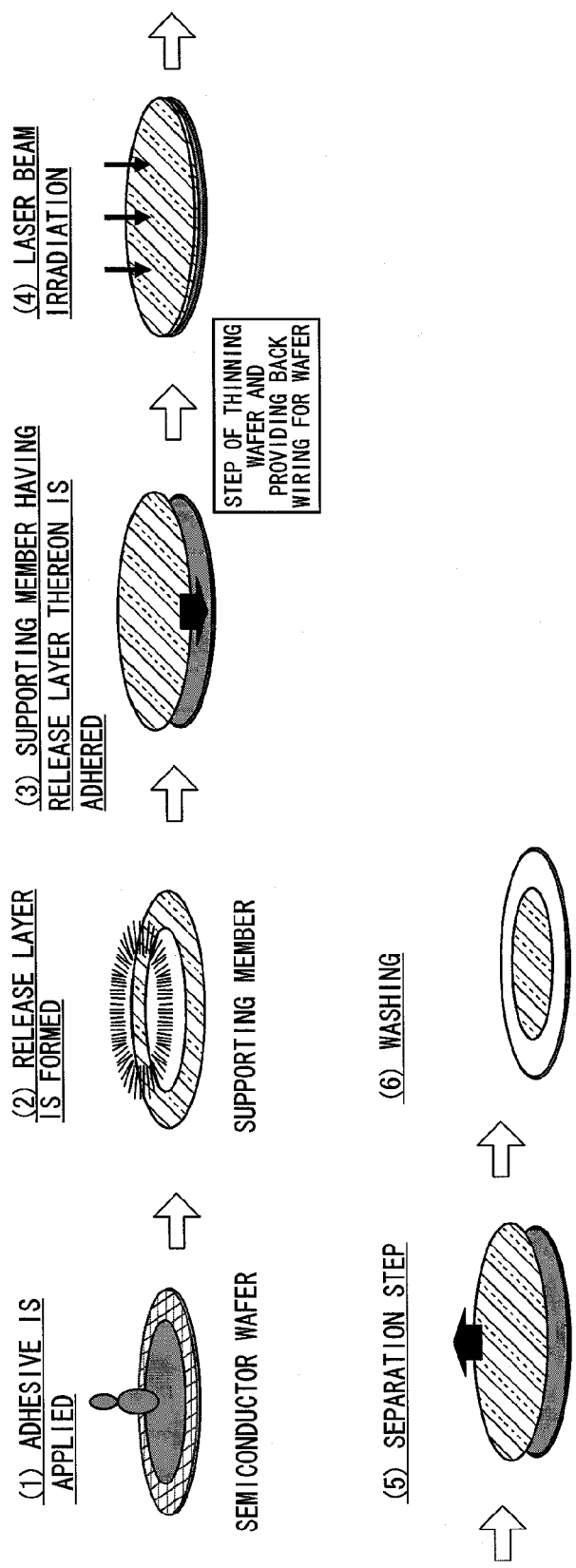

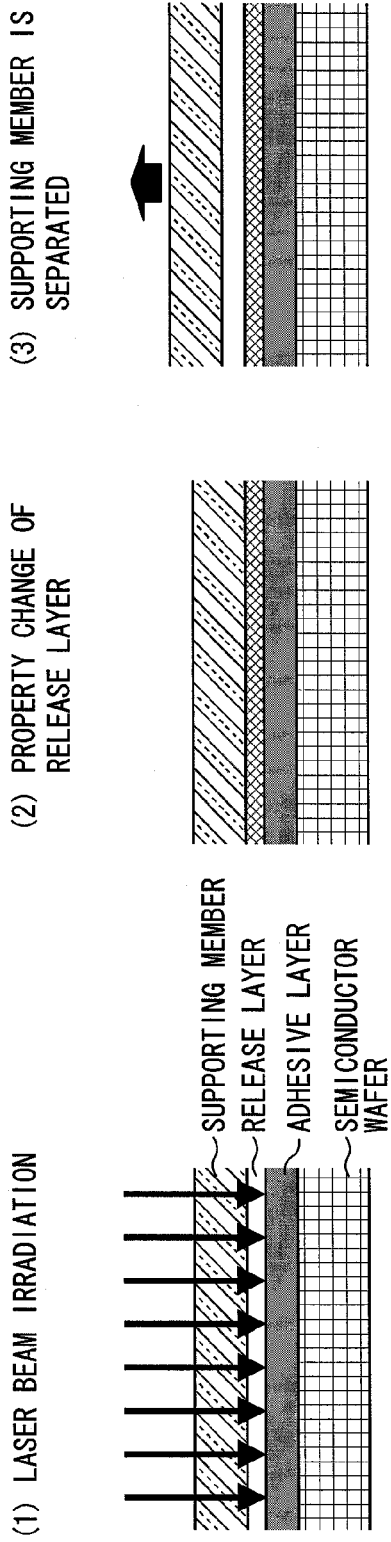

LAMINATE AND METHOD FOR SEPARATING THE SAME

This application is the U.S. National Phase under 35 U.S.C. §371 of International Application No. PCT/JP2011/069173, filed Aug. 25, 2011, designating the U.S., and published in Japanese as WO 2012/056803 on May 3, 2012, which claims priority to Japanese Patent Application No. 2010-243160, filed Oct. 29, 2010; and to Japanese Patent Application No. 2011-102229, filed Apr. 28, 2011. The entire content of these priority applications is incorporated herein by reference.

TECHNICAL FIELD

The present invention relates to (i) a laminate produced by adhering together a supporting member and a supported substrate supported by the supporting member and (ii) a method for separating the laminate.

BACKGROUND ART

As mobile phones, digital AV devices, IC cards and the like are highly functionalized, it is more demanded that a semiconductor silicon chip (hereafter referred to as "chip") be highly integrated in a package by making a mounted chip smaller and thinner. For instance, there is a demand for thinning of an integrated circuit obtained by packaging a plurality of chips, such as CSP (chip size package) and MCP (multi-chip package). In order to fulfill high integration of a chip in a package, it is necessary to thin a chip down to a range of 25 μm to 150 μm.

However, a semiconductor wafer (hereafter referred to as "wafer") serving as a base of a chip becomes thin by grinding. Therefore, strength of the wafer decreases. This is likely to result in a crack or a warpage in the wafer. Furthermore, it is difficult to automatically carry the wafer whose strength decreases due to its smaller thickness. Therefore, it is necessary to manually carry the wafer and it is troublesome to handle the wafer.

For this reason, there has been developed a wafer handling system for reinforcement of a wafer, by which to adhere a plate-like member called "support plate" which is composed of glass, silicon, hard plastic or the like, to a wafer to be ground, thereby preventing a crack and a warpage in the wafer. Since such a wafer handling system can reinforce a wafer, it is possible to automatically carry a semiconductor wafer having been made thinner.

In the wafer handling system, (i) a wafer and a support plate are adhered together with the use of various kinds of thermoplastic resins or adhesives, (ii) the wafer adhered to the support plate is thinned, and then (iii) the support plate is separated from the wafer prior to dicing of the wafer. In order to thin the wafer to 150 μm or less, for example, it is highly preferable to firmly adhere the wafer and the support plate together.

CITATION LIST

Patent Literatures

Patent Literature 1
Japanese Patent Application Publication, Tokukai, No. 2007-188967 A (Publication Date: Jul. 26, 2007)
Patent Literature 2
Japanese Patent Application Publication, Tokukai, No. 2004-64040 A (Publication Date: Feb. 26, 2004).

SUMMARY OF INVENTION

Technical Problem

However, in a case where a wafer and a support plate are firmly adhered together, it may be difficult to separate the support plate from the wafer without damaging the wafer, depending on an adhesive used. This is because, while a strong adhesive is effective in thinning of a wafer, such an adhesive causes damage to the wafer having a reduced strength when the support plate is separated from the wafer.

In view of the circumstances, the automation of the wafer handling system requires development of an extremely difficult temporary-fixing technique that separates, while achieving temporary and yet firm fixing of a wafer to a support plate, the wafer from the support plate without damaging the wafer.

The present invention has been made in view of the foregoing problem, and it is an object of the present invention to provide (i) a laminate configured such that a target object is firmly adhered to and supported by a supporting member but the supporting member can be easily separated from the target object and (ii) a method for separating the laminate.

Solution to Problem

A laminate of the present invention includes: a supporting member which is light transmissive; a supported substrate supported by the supporting member; an adhesive layer provided on a surface of the supported substrate which surface faces toward the supporting member; and a release layer which is made of a fluorocarbon and is provided between the supporting member and the supported substrate, the release layer having a property that changes when the release layer absorbs light coming through the supporting member.

A separation method of the present invention is a method for separating the supported substrate and the supporting member from each other which are included in a laminate, said method including the step of: changing a property of the release layer by irradiating the release layer with light through the supporting member.

Advantageous Effects of Invention

The present invention makes it possible to provide (i) a laminate configured such that a target object is firmly adhered to and supported by a supporting member but the supporting member can be easily separated from the target object and (ii) a method for separating the laminate.

BRIEF DESCRIPTION OF DRAWINGS

FIG. 1 is a view illustrating (i) a method for producing a laminate of the present invention and (ii) a process of separating a semiconductor wafer from the laminate.

FIG. 2 is a view illustrating a method for separating a laminate of the present invention.

DESCRIPTION OF EMBODIMENTS

[Laminate]

A laminate of the present invention includes (i) a supporting member that is light transmissive, (ii) a supported substrate supported by the supporting member, (iii) an adhesive layer provided on a surface of the supported substrate which surface faces toward the supporting member, and (iv) a release layer which is provided between the supporting member and the supported substrate and is made of a fluorocarbon.

The release layer has a property that changes when the release layer absorbs light coming through the supporting member.

In other words, the laminate of the present invention is constituted by the supported substrate, the adhesive layer, the release layer, and the supporting member which are stacked together in this order. The supported substrate is temporarily fixed to the supporting member via the adhesive layer and the release layer.

The laminate of the present invention can be used for any purpose, provided that the supported substrate is temporarily fixed to the supporting member. The present embodiment discusses an example of a laminate which is (i) for use in a wafer support system and (ii) constituted by a support plate (supporting member) and a semiconductor wafer (supported substrate) temporarily fixed to the support plate.

(Release Layer)

As described above, the laminate of the present invention includes the release layer made of a fluorocarbon. Since the release layer is made of a fluorocarbon, the release layer changes its property upon absorbing light. As a result, the release layer loses strength or adhesion that it had before the light irradiation. Hence, it is possible to easily separate the supported substrate from the supporting member by applying a little external force (for example, by lifting up the supporting member), because the release layer is broken by the little external force.

It should be noted that, from one point of view, a film of a fluorocarbon which constitutes the release layer can suitably be formed by plasma CVD. Examples of the fluorocarbon encompass, but not limited to, CxFy (perfluorocarbons) and CxHyFz (where x, y, and z are natural numbers). The fluorocarbon can be, for example, $CHF_3$, $CH_2F_2$, $C_2H_2F_2$, $C_4F_8$, $C_2F_6$, or $C_5F_8$. Furthermore, to the fluorocarbon which is to form the release layer, (i) an inert gas such as nitrogen, helium, or argon, (ii) oxygen, (iii) a hydrocarbon such as alkane or alkene, (iv) carbon dioxide, or (v) hydrogen, can be added as needed. Any of these gases can also be used in combination (e.g. a mixture of a fluorocarbon, hydrogen, and nitrogen). The release layer can be either made from one fluorocarbon or made from two or more fluorocarbons.

Different types of fluorocarbons absorb light having different wavelength ranges. By irradiating the release layer with light corresponding to a range of wavelengths that the fluorocarbon constituting the release layer absorbs, it is possible to suitably change the property of the fluorocarbon. It is preferable that optical absorbance of the release layer is 80% or more.

Light for irradiation of the release layer need only be suitably selected according to a wavelength that the fluorocarbon absorbs. Examples of the light encompass (i) laser beams produced by (a) solid-state lasers such as a YAG laser, a ruby laser, a glass laser, a $YVO_4$ laser, an LD laser, and a fiber laser, (b) liquid lasers such as a dye laser, (c) gas lasers such as a $CO_2$ laser, an excimer laser, an Ar laser, and an He—Ne laser, (d) semiconductor lasers, and (e) free electron lasers and (ii) light other than laser beams.

In this specification, the phrase "fluorocarbon changes its property" means bringing about (i) a state in which a release layer made of the fluorocarbon is readily broken when a little external force is applied thereto or (ii) a state in which the adhesion is weak between the release layer and a member in contact with the release layer.

As described above, the release layer can be suitably formed on the supporting member by plasma CVD. The release layer can also be formed by other known techniques. A thickness of the release layer is not particularly limited, provided that the release layer is thick enough to adequately absorb light being used. Note however that, for example, the release layer has a thickness of preferably 0.05 μm to 100 μm, and particularly preferably 0.1 μm to 50 μm.

As described above, the release layer is, for example, preferably provided between the supporting member and the adhesive layer. That is, it is preferable that there is the adhesive layer between the release layer and the supported substrate. This makes it possible to prevent light, which passes through the supporting member and strikes the release layer, from reaching the supported substrate. Therefore, in a case where the supported substrate has, on its surface in contact with the adhesive layer, a microstructure etc. that requires protection, it is possible to prevent such a microstructure from being adversely affected by light irradiation.

Furthermore, in a case where a surface of the release layer which surface faces the adhesive layer is flat (i.e. there is no unevenness), it is possible to easily form the release layer and also possible to adhere the release layer to the adhesive layer uniformly.

Note that the laminate of the present invention may further include at least one additional layer between the release layer and the supporting member. In this case, the additional layer is made of a light transmissive material. This means that it is possible to add, to the laminate as appropriate, a layer which imparts preferable properties etc. to the laminate without blocking light travelling to the release layer. Note that different types of fluorocarbons (for the release layer) may require light having different wavelengths to change their properties. Therefore, a material constituting the additional layer does not need to be one that transmits all wavelengths of light. The material can be selected as appropriate from those which transmit light having wavelengths at which the fluorocarbon changes its property. The fluorocarbon changes its property at wavelengths of, but not limited to, for example 600 nm and less. In any case, since (i) the release layer is fixed to the supporting member directly or via an additional layer and (ii) the release layer and the supported substrate are adhered together via the adhesive layer, the supported substrate is temporarily fixed to the supporting member. For example, the additional layer can be an adhesive layer via which the release layer and the supporting member are adhered together.

(Supporting Member)

As described earlier, the supporting member is light transmissive. This is to cause external light, which shines on the laminate from outside, to pass through the supporting member and reach the release layer. Therefore, the supporting member does not need to transmit all wavelengths of light, and only needs to transmit light that the release layer absorbs (i.e. light having a desired wavelength(s)).

The supporting member is a member that supports the supported substrate. Therefore, the strength of the supporting member need only be high enough to prevent, in a case where the supported substrate is processed or transported, the supported substrate from being damaged or deformed.

The supporting member is made from, for example, glass or silicon etc. Note, however, that the supporting member can be made from any material provided that the supporting member has properties which can accomplish the above purposes.

(Adhesive Layer)

The adhesive layer is a member which covers and protects a surface of the supported substrate as well as fixes the supported substrate to the supporting member. Therefore, the adhesive layer needs to have enough adhesion and strength so that, while the supported substrate is being processed or transported, the supported substrate does not detach from the supporting member and the surface, which requires protection, of the supported substrate is not exposed. On the other hand, it is necessary that the adhesive layer be easily detachable or removable from the supported substrate when the supported substrate does not have to be fixed to the supporting member anymore.

Therefore, the adhesive layer is usually constituted by an adhesive which (i) is highly adhesive and (ii) becomes less adhesive as a result of some process or is soluble in a particular solvent. Examples of the adhesive which can be used for the adhesive layer of the present invention encompass various adhesives known in the field, such as acrylic adhesives, novolac adhesives, naphthoquinone adhesives, hydrocarbon adhesives, and polyimide adhesives.

Note that it is preferable that the adhesive layer is made from a resin other than a photo-curable resin (e.g. UV-curable resin). This is because a residue of the photo-curable resin may remain around fine protrusions and depressions on the surface of the supported substrate after the adhesive layer is detached or removed. It is especially preferable that the adhesive layer is constituted by an adhesive that is soluble in a particular solvent. This is because such an adhesive can be removed by being dissolved in the solvent without applying a physical force to the supported substrate. That is, such an adhesive can be easily removed even from a supported substrate having a reduced strength without causing damage or deformation to/of the supported substrate.

[Method for Producing Laminate]

The following description will discuss, with reference to FIG. 1, a method for producing a laminate of the present invention. FIG. 1 is a view illustrating (i) the method for producing the laminate and (ii) a process of separating a semiconductor wafer from the laminate.

First, as illustrated in FIG. 1, an adhesive is applied to a surface of a semiconductor wafer (supported substrate) which surface has a desired device thereon (step (1) in FIG. 1). The adhesive applied to the semiconductor wafer here is, for example, one that is dissolved in a solvent. Then, the adhesive is baked in stages at increasing temperatures, whereby the adhesive hardens and forms an adhesive layer.

Next, a film of the foregoing fluorocarbon is formed on a surface of a supporting member by, for example, plasma CVD. In this way, a release layer is formed (step (2) in FIG. 1).

Then, the adhesive layer formed on the surface of the semiconductor wafer and the release layer formed on the surface of the supporting member are placed against each other, and pressure is applied in a vacuum at 215° C. so that the adhesive layer and the release layer are adhered together (step (3) in FIG. 1).

In this way, the laminate of the present invention can be produced. Note that how to form an adhesive layer and a release layer and how to adhere them together are selected as appropriate from a variety of conventional methods, according to (i) a condition (unevenness on a surface or strength etc.) of the supported substrate and (ii) materials for the adhesive layer, the release layer, and the supporting member.

The laminate is then subjected to processing of the semiconductor wafer. After that, light irradiation, separation of the supporting member, and removal of the adhesive layer are carried out, whereby only the semiconductor wafer remains. The following description will discuss the step after the processing of the semiconductor wafer to the step of removing the semiconductor wafer.

[Method for Separating the Laminate]

As illustrated in FIG. 1, after the processing of the semiconductor wafer, the laminate receives a laser beam on its supporting member-side surface (step (4) in FIG. 1). Upon receiving the laser beam (step (1) of FIG. 2), the release layer changes its property (step (2) in FIG. 2). FIG. 2 is a view for describing a method for separating the laminate.

Next, the semiconductor wafer is separated from the supporting member (step (5) in FIG. 1). The release layer, whose property has changed, has a significantly reduced strength. Therefore, the release layer can be easily broken by, for example, applying a little external force to lift up the supporting member. This separates the supporting member from the laminate (step (3) in FIG. 2).

The adhesive layer is removed by spraying a solvent to the adhesive layer (step (6) in FIG. 1). Note here that, after the separation of the supporting member, there is a possibility that a residue of the release layer remains on the adhesive layer. If the amount of the residue is small, the solvent for dissolving the adhesive layer as described above is all that is necessary. Note, however, that a solvent for dissolving a material for the release layer may be sprayed prior to the removal of the adhesive layer.

As has been described, since the laminate of the present invention includes the foregoing release layer, it is possible to easily separate, by light irradiation, the supporting member from the supported substrate.

EXAMPLES

The following description will discuss examples of a laminate in accordance with the present invention. Note that the following examples serve solely to assist the understanding of the present invention, and do not in any way limit the scope of the present invention.

Example 1

(Production of Laminate)

A laminate in accordance with Example 1 was produced in the following manner. In a plasma CVD device, a $CHF_3$ gas was used to form a fluorocarbon film on a plate-like supporting member having a thickness of 0.7 mm. In this way, a supporting member on which a release layer having a thickness of 1 µm was formed was obtained.

Next, on a semiconductor wafer substrate (an unground silicon wafer having a diameter of 150 mm) having a thickness of 725 µm, a hydrocarbon adhesive "TZNR-A3007" (manufactured by TOKYO OHKA KOGYO Co., Ltd.) was applied so that the thickness of the hydrocarbon adhesive after baking would be 50 µm. Then, the hydrocarbon adhesive was baked in stages at 90° C., 160° C. and 220° C. for 10 minutes to 20 minutes each, thereby forming an adhesive layer on the semiconductor wafer substrate. Then, the release layer and the adhesive layer were placed against each other and adhered together, thereby obtaining the laminate.

(Evaluation of Separability)

The laminate in accordance with Example 1 was subjected to processing described below, and then whether or not the supporting member was separable from the semiconductor wafer substrate was evaluated.

The semiconductor wafer substrate of the laminate thus obtained was thinned. Then, the release layer was irradiated with a green laser beam having a wavelength of 532 nm which comes from a supporting member-side of the laminate. Specifically, two positions on the laminate were irradiated with green laser beams with pulse frequencies of 30 kHz and 50 kHz, respectively, each of which green laser beams had a wavelength of 532 nm and a beam shape of 60 µm per side. The laser irradiation was carried out under the condition where a scan pitch was 120 µm, an average power was 0.6 W, and a scan rate was 3000 mm/sec. The laminate was scanned with the green laser beams once.

As a result, the release layer of the laminate in accordance with Example 1 changed its property upon irradiation with the green laser beams. The supporting member was easily separated from the semiconductor wafer substrate only by being lifted up. Furthermore, surfaces of the supporting member and the semiconductor wafer substrate were visually checked after the separation of the supporting member. As a result, no residues were found, although a small amount of the fluorocarbon which changed into black powder remained on the semiconductor wafer substrate.

As described above, by making the release layer of the laminate from a fluorocarbon, it was possible to very easily separate the supported substrate from the supporting member by changing a property of the release layer by laser irradiation.

Example 2

The same processes as in Example 1 were carried out except that a $CHF_3$ gas was replaced with a $C_4F_8$ gas, and whether or not the supporting member was separable from the semiconductor wafer substrate was evaluated.

As a result, also in Example 2, as is the case with Example 1, it was possible to very easily separate the supported substrate from the supporting member by changing a property of the release layer by laser irradiation.

INDUSTRIAL APPLICABILITY

According to the present invention, it is possible to provide a temporarily fixed laminate for use in production of various products. Particularly, it is possible to provide a laminate suitable for a step of temporarily fixing a semiconductor wafer or a chip on a variety of supporting members and processing the semiconductor wafer or the chip.

What is claimed is:
1. A laminate comprising:
a supporting member which is light transmissive;
a supported substrate supported by the supporting member;
an adhesive layer provided on a surface of the supported substrate, wherein said surface faces toward the supporting member; and
a release layer which is made of a fluorocarbon and is provided between the supporting member and the supported substrate,
the release layer has a property that changes when it absorbs light coming through the supporting member.
2. The laminate as set forth in claim 1, wherein the release layer is formed by plasma CVD.
3. The laminate as set forth in claim 1, wherein the supporting member is made of glass or silicon.
4. The laminate as set forth in claim 1, further comprising at least one layer provided between the supporting member and the release layer.
5. A method for separating the supported substrate and the supporting member from each other which are included in a laminate as set forth in claim 1,
said method comprising changing a property of the release layer by irradiating the release layer with light through the supporting member.

* * * * *